US009257528B2

(12) United States Patent
Chung et al.

(10) Patent No.: US 9,257,528 B2
(45) Date of Patent: Feb. 9, 2016

(54) GRAPHENE ELECTRONIC DEVICE AND METHOD OF FABRICATING THE SAME

(71) Applicant: Samsung Electronics Co., Ltd., Suwon-Si, Gyeonggi-Do (KR)

(72) Inventors: Hyun-jong Chung, Hwaseong-si (KR); Jin-seong Heo, Seoul (KR); Hee-jun Yang, Seoul (KR); Sun-ae Seo, Hwaseong-si (KR); Sung-hoon Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/244,275

(22) Filed: Apr. 3, 2014

(65) Prior Publication Data

US 2014/0225068 A1    Aug. 14, 2014

Related U.S. Application Data

(62) Division of application No. 13/329,842, filed on Dec. 19, 2011, now Pat. No. 8,728,880.

(30) Foreign Application Priority Data

Dec. 17, 2010 (KR) ........................ 10-2010-0129995

(51) Int. Cl.
| | | |
|---|---|---|
| *H01L 29/66* | (2006.01) | |
| *H01L 29/423* | (2006.01) | |
| *H01L 29/786* | (2006.01) | |
| *H01L 29/775* | (2006.01) | |

(52) U.S. Cl.
CPC .... *H01L 29/66477* (2013.01); *H01L 29/42384* (2013.01); *H01L 29/775* (2013.01); *H01L 29/78684* (2013.01)

(58) Field of Classification Search
CPC ............ H01L 21/8213; H01L 21/8221; H01L 27/0207; H01L 27/11; H01L 27/0688; H01L 27/1104; H01L 29/12; H01L 29/16; H01L 29/0673; H01L 29/78
See application file for complete search history.

(56) References Cited

U.S. PATENT DOCUMENTS

| | | | |
|---|---|---|---|
| 7,262,991 B2 * | 8/2007 | Zhang et al. | 365/185.01 |
| 8,247,806 B2 | 8/2012 | Chae et al. | |
| 8,592,799 B2 | 11/2013 | Yang et al. | |
| 2010/0006823 A1 | 1/2010 | Anderson et al. | |
| 2011/0017979 A1 * | 1/2011 | Meric et al. | 257/29 |
| 2011/0163289 A1 * | 7/2011 | Zhu | 257/9 |
| 2011/0233513 A1 * | 9/2011 | Dimitrakopoulos et al. | 257/9 |

FOREIGN PATENT DOCUMENTS

| | | |
|---|---|---|
| JP | 64-061958 | 3/1989 |
| JP | 6318723 A | 11/1994 |

(Continued)

*Primary Examiner* — Kyoung Lee
(74) *Attorney, Agent, or Firm* — Harness, Dickey & Pierce, P.L.C.

(57) ABSTRACT

A graphene electronic device includes a graphene channel layer on a substrate, a source electrode on an end portion of the graphene channel layer and a drain electrode on another end portion of the graphene channel layer, a gate oxide on the graphene channel layer and between the source electrode and the drain electrode, and a gate electrode on the gate oxide. The gate oxide has substantially the same shape as the graphene channel layer between the source electrode and the drain electrode.

17 Claims, 5 Drawing Sheets

(56) References Cited

FOREIGN PATENT DOCUMENTS

| | | |
|---|---|---|
| JP | 9116179 A | 5/1997 |
| JP | 11266029 A | 9/1999 |
| JP | 2009-143761 A | 7/2009 |
| JP | 2009-155168 A | 7/2009 |
| JP | 2009-164432 A | 7/2009 |
| JP | 2009-277803 A | 11/2009 |
| JP | 2009-302274 A | 12/2009 |
| JP | 2010-135471 A | 6/2010 |
| KR | 10-0543535 B1 | 11/2001 |
| KR | 10-0543507 B1 | 12/2004 |
| KR | 10-0654103 B1 | 11/2006 |

* cited by examiner

GRAPHENE ELECTRONIC DEVICE AND METHOD OF FABRICATING THE SAME

CROSS-REFERENCE TO RELATED APPLICATIONS

This application is a divisional of U.S. application Ser. No. 13/329,842, filed on Dec. 19, 2011, which claims the benefit of Korean Patent Application No. 10-2010-0129995, filed on Dec. 17, 2010, in the Korean Intellectual Property Office, the disclosure of which is incorporated herein in its entirety by reference.

BACKGROUND

1. Field

Example embodiments relate to a graphene electronic device including a gate oxide as a protective layer formed on a graphene channel layer, and a method of fabricating the graphene electronic device.

2. Description of the Related Art

Graphene having a 2-dimensional hexagonal carbon structure is a material that can replace semiconductors. Graphene is a zero gap semiconductor and has a mobility of 100,000 $cm^2V^{-1}s^{-1}$ at room temperature, which is about 100 times higher than that of silicon. Thus, graphene can be applied to high frequency devices, e.g., radio frequency (RF) devices.

A graphene nano-ribbon (GNR) having a graphene channel width of 10 nm or less has a band gap by a size effect. Using the GNR, a field effect transistor that can be operated at room temperature can be manufactured.

Graphene electronic devices are electronic devices that include graphene, e.g., field effect transistors and RF transistors. Graphene electronic devices can be damaged by wet etchant when a graphene is patterned. In addition, if a general oxygen plasma process is used in order to remove a photoresist left on the graphene, the oxygen plasma process cannot be used since exposed graphene is removed together with the photoresist. Thus, the photoresist can partially remain on the graphene. Therefore, obtaining desired properties of electronic devices having graphene may be difficult.

SUMMARY

Example embodiments provide methods of fabricating a graphene electronic device for preventing or inhibiting characteristics of graphene from being damaged during a patterning operation of graphene by previously forming a gate oxide layer as a protective layer on a layer for forming a channel.

Additional aspects will be set forth in part in the description which follows and, in part, will be apparent from the description, or may be learned by practice of the presented embodiments.

According to example embodiments, a graphene electronic device may include a graphene channel layer on a substrate, a source electrode on an end portion of the graphene channel layer and a drain electrode on another end portion of the graphene channel layer, a gate oxide on the graphene channel layer and between the source electrode and the drain electrode, and a gate electrode on the gate oxide. The gate oxide may have substantially the same shape as the graphene channel layer between the source electrode and the drain electrode.

The substrate may be a nonconductive substrate. The substrate may be a silicon substrate, and an insulating layer may be between the silicon substrate and a graphene channel layer. The graphene channel layer may have a channel width of about 1 to about 20 nm, and the graphene electronic device may be a field effect transistor.

The graphene channel layer may have a channel width of at least 100 nm, and the graphene electronic device may be a radio frequency (RF) transistor. The graphene channel layer may include a chemical vapor deposition (CVD) graphene. The graphene channel layer may include at least one of single-layered graphene and a bi-layered graphene.

According to example embodiments, a method of fabricating a graphene electronic device may include transferring a graphene layer on a substrate, forming an insulating layer on the graphene layer, the insulating layer covering the graphene layer, exposing portions of the graphene layer by patterning the insulating layer, forming a source electrode and a drain electrode on the exposed portions of the graphene layer, the source electrode and the drain electrode are spaced apart from each other, forming a photoresist layer on the graphene layer, the photoresist layer having a channel shape, forming a graphene channel layer by removing portions of the graphene layer exposed by the source electrode, the drain electrode, and the photoresist layer, removing the photoresist layer, and forming a gate electrode on the insulating layer.

Oxygen plasma may be used in the forming of the graphene layer. Oxygen plasma may also be used in the removing of the photoresist layer.

According to example embodiments, a method of fabricating a graphene electronic device may include transferring a graphene layer on a substrate, forming a source electrode and a drain electrode on the graphene layer, the source electrode and the drain electrode being spaced apart from each other, forming an insulating layer covering the source electrode, the drain electrode and the graphene layer, forming a photoresist layer on the insulating layer between the source electrode and the drain electrode, the photoresist layer having a channel shape, removing portions of the insulating layer exposed by the photoresist layer, forming a graphene channel layer by removing portions of the graphene layer exposed by the source electrode, the drain electrode, and the photoresist layer, removing the photoresist layer, and forming a gate electrode on the insulating layer.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
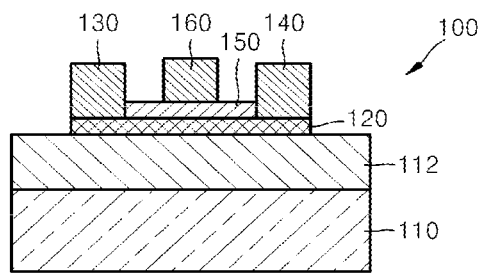
FIG. 1 is a schematic cross-sectional view showing a structure of a graphene electronic device according to example embodiments.

Reference will now be made in detail to embodiments, examples of which are illustrated in the accompanying drawings. In the drawings, the thicknesses of layers and regions are exaggerated for clarity, and like reference numerals refer to the like elements throughout.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic cross-sectional view showing a structure of a graphene electronic device 100 according to example embodiments. Referring to FIG. 1, an insulating layer 112 may be formed on a silicon substrate 110. The insulating layer 112 may be formed of silicon oxide with a thickness of about 100 to about 300 nm. A nonconductive substrate may be used instead of the silicon substrate 110, and in example embodiments, the insulating layer 112 may be omitted.

A graphene channel layer 120 may be formed on the insulating layer 112. The graphene channel layer 120 may be formed by transferring and then patterning chemical vapor deposition (CVD) graphene. The graphene channel layer 120 may include a single-layered graphene or a bi-layered graphene.

A source electrode 130 and a drain electrode 140 may be formed on end portions of the graphene channel layer 120, respectively. A gate oxide 150 may be formed between the source electrode 130 and the drain electrode 140 on the graphene channel layer 120. The gate oxide 150 may be formed of a material having a higher dielectric constant, e.g., alumina and/or hafnium oxide. The gate oxide 150 may be formed to have a thickness of about 5 to about 30 nm. The gate oxide 150, the source electrode 130, and the drain electrode 140 may have substantially the same shape as the graphene channel layer 120 to cover an entire surface of the graphene channel layer 120 underneath. A gate electrode 160 may be formed on the gate oxide 150.

Figure 2:
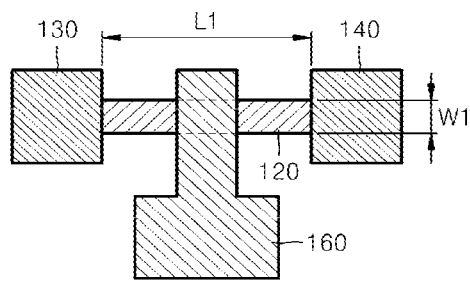
FIG. 2 is a plan view of the graphene electronic device of FIG. 1, according to example embodiments.

FIG. 2 is a plan view of the graphene electronic device of FIG. 1, according to example embodiments. For convenience of illustration, only electrodes and channels are illustrated in FIG. 2. Graphene disposed below the source and drain electrodes 130 and 140 is not illustrated.

Referring to FIG. 2, a distance L1 of the graphene channel layer 120 between the source electrode 130 and the drain electrode 140 may be about 100 nm to about 10 μm. In A width W1 of the graphene channel layer 120 may be about 1 nm to about 20 nm. The graphene channel layer 120 having the width W1 has semiconductor properties, and thus has a band gap due to a size effect. The graphene electronic device of FIG. 2 may be a field effect transistor. The field effect transistor using graphene as a channel may be operated at room temperature.

Figure 3:
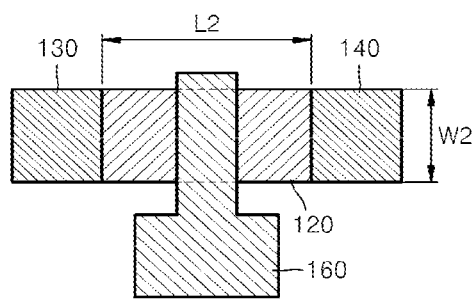
FIG. 3 is a plane view of a graphene electronic device according to example embodiments.

FIG. 3 is a plane view of a graphene electronic device according to example embodiments. For convenience of illustration, only electrodes and channels are illustrated in FIG. 3. A lateral cross-sectional of the graphene electronic device of FIG. 3 may be substantially the same as that in FIG. 1, and thus, is not provided here.

Referring to FIG. 3, a distance L2 of the graphene channel layer 120 between the source electrode 130 and the drain electrode 140 may be about 100 nm to about 10 μm. In A width W2 of the graphene channel layer 120 may be about 100 nm or more. The graphene channel layer 120 having the width W2 may be a conductor, and has a mobility of 100,000 $cm^2V^{-1}s^{-1}$ at room temperature, which may be approximately 100 times higher than that of silicon. The graphene electronic device of FIG. 3 may be a radio frequency (RF) transistor. The RF transistor amplifies a signal input to the source electrode 130 and outputs the amplified signal to the drain electrode 140.

FIGS. 4A through 4E are side views for explaining a method of manufacturing a graphene electronic device 200, according to example embodiments.

Figure 4A:
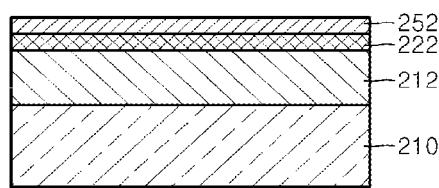
FIGS. 4A through 4E are side views for explaining a method of manufacturing a graphene electronic device, according to example embodiments.

Referring to FIG. 4A, an insulating layer 212 may be formed on a silicon substrate 210. The insulating layer 212 may be formed of silicon oxide with a thickness of about 100 to about 300 nm. A graphene layer 222 may be formed on the insulating layer 212 by transferring CVD graphene. The graphene layer 222 may include a single-layered graphene or a bi-layered graphene.

An insulating layer 252 may be formed on the graphene layer 222. The insulating layer 252 may be formed of a material having a higher dielectric constant, e.g., alumina and/or hafnium oxide, with thickness of about 5 to about 30 nm by using an atomic layer deposition (ALD) method. A portion of the insulating layer 252 may be a gate oxide 250 described below, and serves as a protective layer for preventing or inhibiting graphene from an etch etchant or an oxygen plasma process.

Figure 4B:
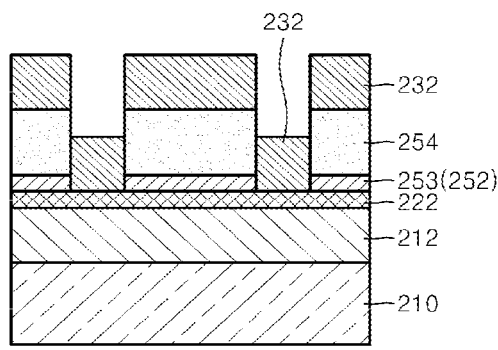

Referring to FIG. 4B, portions of the insulating layer 252, on which source and drain electrodes are to be formed, may be exposed by coating a photoresist 254 on the insulating layer 252 and then patterning the photoresist 254. First regions of the graphene layer 222, on which the source and drain electrodes are to be formed, may be exposed by etching the insulating layer 252 using an etchant, e.g., diluted hydrofluoric acid (DHF). When the insulating layer 252 is etched using DHF, the graphene layer 222 may be barely damaged. The patterned insulating layer 253 may be formed.

Even if the first regions of the graphene layer 222 are slightly damaged, metal may be deposited on the first regions of the graphene to form a metal-graphene junction. Thus, the damage to the first regions of the graphene layer 222 does not affect the properties of a portion of the graphene layer 222 covered by the patterned insulating layer 253. The graphene of a region on which a channel layer is to be formed may be covered by the insulating layer 253 serving as a protective layer. Thus, graphene may be barely damaged during the above-described etching process. An electrode material 232 may be deposited on the photoresist 254. The photoresist 254 may be removed using a lift-off process.

Figure 4C:
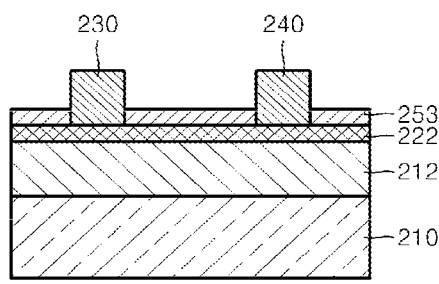

Referring to FIG. 4C, a source electrode 230 and a drain electrode 240 may be formed on the graphene layer 222 so as to be spaced apart from each other. Generally, after the photoresist 254 is lifted-off, the photoresist 254 may partially remain on lateral surfaces of the source electrode 230 and the drain electrode 240. The left portion of the photoresist 254 may be removed by using oxygen plasma. In example embodiments, the insulating layer 253, the source electrode 230, and the drain electrode 240 may serve as a protective layer for preventing or inhibiting oxygen plasma from directly contacting the graphene layer 222.

Figure 4D:
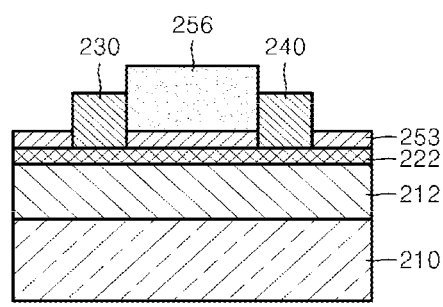

Referring to FIG. 4D, a photoresist 256 may be coated on the graphene layer 222, and the photoresist 256 may be patterned to have a channel shape. If the graphene electronic device to be formed as a field effect transistor as shown in FIG. 2, the photoresist 256 may have a channel width of about 1 to about 20 nm. If the graphene electronic device to be formed is a RF transistor as shown in FIG. 3, the photoresist 256 may have a channel width of about 100 nm or more.

Figure 4E:
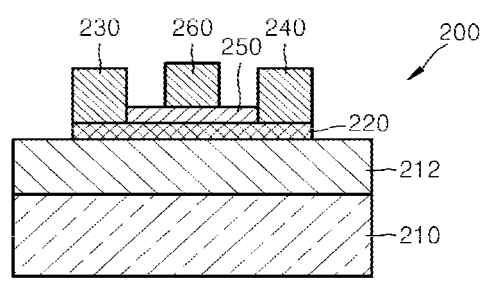

Referring to FIG. 4E, portions of the insulating layer 253 and the graphene layer 222, which are exposed by the photoresist 256, the source electrode 230, and the drain electrode 240, may be sequentially removed. The patterned portion of the insulating layer 252 may be a gate oxide 250. The patterned portion of the graphene layer 222 may be a graphene channel layer 220. The graphene layer 222 may be patterned using a dry etch method, for example, an oxygen plasma method. The photoresist 256 may also be removed by using oxygen plasma. A gate electrode 260 may be formed on the gate oxide 250 by using a well-known semiconductor process.

As described above, a layer for forming a gate oxide may be used to protect a region for forming the graphene channel layer 220, and then remaining portions of the photoresist 256 may be removed by using oxygen plasma. Thus, the layer for forming the gate oxide may prevent or inhibit the graphene channel layer 220 from being damaged.

Figure 5A:
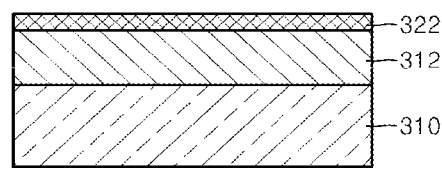
FIGS. 5A through 5E are side views for explaining a method of manufacturing a graphene electronic device, according to example embodiments.

FIGS. 5A through 5E are side views for explaining a method of manufacturing a graphene electronic device 300, according to example embodiments. Referring to FIG. 5A, an insulating layer 312 may be formed on a silicon substrate 310. The insulating layer 312 may be formed of silicon oxide with a thickness of about 100 to about 300 nm. A graphene layer 322 may be formed on the insulating layer 312 by transferring CVD graphene. The graphene layer 322 may include a single-layered graphene or a bi-layered graphene.

Figure 5B:
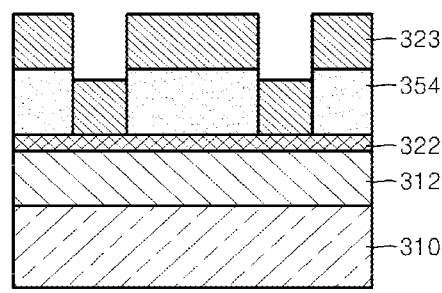

Referring to FIG. 5B, second regions of the graphene layer 322, on which source and drain electrodes are to be formed, may be exposed by coating a photoresist 354 on the graphene layer 322 and then patterning the photoresist 354. When the photoresist 354 is etched by using DHF, the second regions of the graphene layer 322 may be barely damaged. Even if the second regions of the graphene layer 322 are slightly damaged, metal may be deposited on the second regions of the graphene to form a metal-graphene junction. Thus, the damage of the second regions of the graphene layer 322 does not affect the properties of a portion of the graphene layer 322, on which a channel is to be formed. In particular, graphene may be less damaged when the photoresist 354 is etched, than in a case where the insulating layer 252 is etched. An electrode material 323 may be deposited on the photoresist 354. The photoresist 354 may be lifted-off.

Figure 5C:
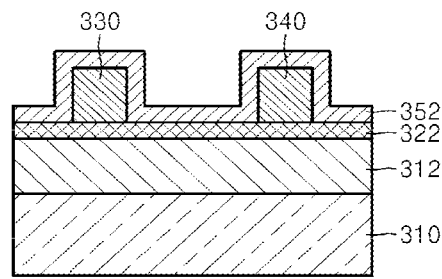

Referring to FIG. 5C, a source electrode 330 and a drain electrode 340 may be formed on the graphene layer 322 so as to be spaced apart from each other. An insulating layer 352 may be formed on the graphene layer 322 so as to cover the source electrode 330 and the drain electrode 340. The insulating layer 352 may be formed of a material having a high dielectric constant, e.g., alumina and/or hafnium oxide, with a thickness of about 5 to about 30 nm by using an ALD method. A portion of the insulating layer 352 may be a gate oxide as described below, and the insulating layer 352 serves as a protective layer for preventing or inhibiting the graphene layer 322 from an etchant or an oxygen plasma process.

Figure 5D:
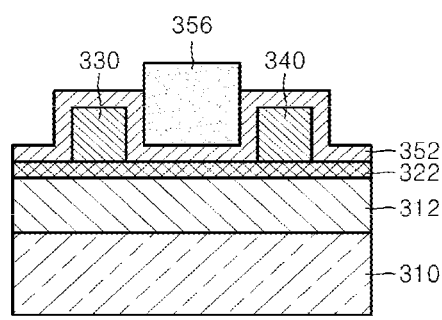

Referring to FIG. 5D, a photoresist material (not shown) may be coated on the graphene layer 322, and then a photoresist 356 may be formed to have a channel shape by patterning the photoresist material. If the graphene electronic device to be formed is a field effect transistor as shown in FIG. 2, the photoresist 356 may have a channel width of about 1 to about 20 nm. If the graphene electronic device to be formed is an RF transistor as shown in FIG. 3, the photoresist 356 may have a channel width of about 100 nm or more.

Figure 5E:
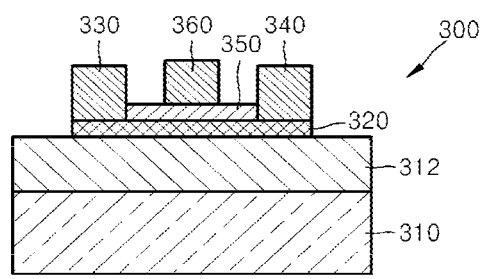

Referring to FIG. 5E, portions of the insulating layer 352, which are exposed by the photoresist 356, may be removed. The patterned portion of the insulating layer 352 may be a gate oxide 350. A graphene channel layer 320 may be formed by removing portions of the graphene layer 322, which are exposed to the source electrode 330 and the drain electrode 340, and the photoresist 356. The portions of the graphene layer 322 may be removed by using a dry etch method, for example, an oxygen plasma method. The photoresist 356 may also be removed together with the portions of the graphene layer 322 by using oxygen plasma. In example embodiments, the graphene channel layer 320 may be protected by the gate oxide 350. A gate electrode 360 may be formed on the gate oxide 350 by using a well-known semiconductor process.

According to the above-described example embodiments, the graphene layer 322 may be protected by the gate oxide 350, and then left portions of the photoresist 356 may be removed by using oxygen plasma. Thus, when the left portions of the photoresist 356 are removed, the gate oxide 350 may prevent or inhibit the graphene layer 322 from being damaged. In addition, when a layer for forming a gate oxide 352 is patterned in order to form a gate electrode 360, the graphene layer 322 covered by the source electrode 330, drain electrode 340 and the layer for forming the gate oxide 352 may be prevented or inhibited from being damaged by the patterning process.

As described above, according to example embodiments, a graphene electronic device includes a gate oxide as a protective layer formed on graphene. Thus, a graphene channel layer may not be damaged during manufacture of the graphene electronic device, thereby maintaining the characteristics of the graphene channel layer.

It should be understood that example embodiments described therein should be considered in a descriptive sense only and not for purposes of limitation. Descriptions of features or aspects within each embodiment should typically be considered as available for other similar features or aspects in other example embodiments.

What is claimed is:

1. A graphene electronic device comprising:
   a graphene channel layer on a substrate, the graphene channel layer consisting of at least one layer of a graphene sheet;
   a source electrode on an end portion of the graphene channel layer and a drain electrode on another end portion of the graphene channel layer;
   a gate oxide on the graphene channel layer and between the source electrode and the drain electrode, the gate oxide having substantially the same shape as the graphene channel layer between the source electrode and the drain electrode when viewed from a plan view; and
   a gate electrode on the gate oxide,
   wherein the graphene channel layer has a channel width of about 1 to about 20 nm, and the graphene electronic device is a field effect transistor.

2. The graphene electronic device of claim 1, wherein the substrate is a nonconductive substrate.

3. The graphene electronic device of claim 1, wherein the substrate is a silicon substrate, further comprising:
   an insulating layer between the silicon substrate and the graphene channel layer.

4. The graphene electronic device of claim 1, wherein the graphene channel layer comprises a chemical vapor deposition (CVD) graphene.

5. The graphene electronic device of claim 1, wherein the graphene channel layer comprises at least one of a single-layered graphene sheet and a bi-layered graphene sheet.

6. A method of fabricating a graphene electronic device, the method comprising:
   transferring a graphene layer on a substrate;
   forming a source electrode and a drain electrode on the graphene layer, the source electrode and the drain electrode being spaced apart from each other;
   forming an insulating layer covering the source electrode, the drain electrode and the graphene layer;
   forming a photoresist layer on the insulating layer between the source electrode and the drain electrode, the photoresist layer having a channel shape;
   removing portions of the insulating layer exposed by the photoresist layer;
   forming a graphene channel layer by removing portions of the graphene layer exposed by the source electrode, the drain electrode, and the photoresist layer;
   removing the photoresist layer; and
   forming a gate electrode on the insulating layer.

7. The method of claim 6, wherein the forming the graphene channel layer comprises using oxygen plasma.

8. The method of claim 6, wherein the removing the photoresist layer comprises using oxygen plasma.

9. The method of claim 6, wherein the forming the graphene channel layer comprises forming the graphene channel layer having a channel width of about 1 to about 20 nm, and wherein the graphene electronic device is a field effect transistor.

10. The method of claim 6, wherein forming the graphene channel layer comprises forming the graphene channel layer having a channel width of at least 100 nm, and wherein the graphene electronic device is a radio frequency (RF) transistor.

11. The method of claim 6, wherein the graphene layer comprises at least one of a single-layered graphene and a bi-layered graphene.

12. The method of claim 7, wherein the graphene layer comprises a chemical vapor deposition (CVD) graphene.

13. A graphene electronic device comprising:
    a graphene channel layer on a substrate, the graphene channel layer consisting of at least one layer of a graphene sheet;
    a source electrode on an end portion of the graphene channel layer and a drain electrode on another end portion of the graphene channel layer;
    a gate oxide on the graphene channel layer and between the source electrode and the drain electrode, the gate oxide having substantially the same shape as the graphene channel layer between the source electrode and the drain electrode when viewed from a plan view; and
    a gate electrode on the gate oxide, wherein the graphene channel layer has a channel width of at least 100 nm, and the graphene electronic device is a radio frequency (RF) transistor.

14. The graphene electronic device of claim 13, wherein the substrate is a nonconductive substrate.

15. The graphene electronic device of claim 13, wherein the substrate is a silicon substrate, further comprising:
    an insulating layer between the silicon substrate and the graphene channel layer.

16. The graphene electronic device of claim 13, wherein the graphene channel layer comprises a chemical vapor deposition (CVD) graphene.

17. The graphene electronic device of claim 13, wherein the graphene channel layer comprises at least one of a single-layered graphene sheet and a bi-layered graphene sheet.

* * * * *